US012764001B2

(12) United States Patent
Peng et al.

(10) Patent No.: US 12,764,001 B2
(45) Date of Patent: Oct. 13, 2026

(54) DECODER FOR DECODING DATA IN A PAM-10 FORMAT BECAUSE OF 1+0.5D PULSE SHAPING, DECODER DEVICE USING THE DECODER, AND RECEIVER USING THE DECODER DEVICE

(71) Applicant: National Tsing Hua University, Hsinchu City (TW)

(72) Inventors: Pen-Jui Peng, Hsinchu City (TW); Yen-Po Lin, Hsinchu City (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 324 days.

(21) Appl. No.: 18/736,089

(22) Filed: Jun. 6, 2024

(65) Prior Publication Data

US 2025/0379772 A1 Dec. 11, 2025

(51) Int. Cl.
*H04L 25/49* (2006.01)
*H03M 1/14* (2006.01)

(52) U.S. Cl.
CPC .......... *H04L 25/4917* (2013.01); *H03M 1/14* (2013.01)

(58) Field of Classification Search
CPC .............................. H04L 25/4917; H03M 1/14
See application file for complete search history.

(56) References Cited

U.S. PATENT DOCUMENTS 11,095,301 B1 * 8/2021 Tang .................. H03M 1/1014
11,115,040 B1 9/2021 Xu
2004/0008794 A1 * 1/2004 McClellan .......... H04L 25/4917 375/353
2005/0089126 A1 * 4/2005 Zerbe .................... H04L 5/1438 375/353
2005/0201491 A1 * 9/2005 Wei ....................... H04L 7/0337 375/326
2010/0120386 A1 5/2010 Konstantinos et al.
(Continued)

OTHER PUBLICATIONS

"A 5-GBs PAM-4 Receiver using time based LSP decoder and S/H Technique for Robustness to Comparator Voltage Variations.", Park et al., IEEE, Feb. 2022. (Year: 2022).*
(Continued)

*Primary Examiner* — Habte Mered
(74) *Attorney, Agent, or Firm* — Birch, Stewart, Kolasch & Birch, LLP

(57) ABSTRACT

A decoder includes a signal amplifier and a decoder unit. The signal amplifier receives a to-be-amplified data signal that originated from an input data signal in a PAM-4 format and that is in a PAM-10 format because of 1+0.5 D pulse shaping, and performs amplification and level shifting on the to-be-amplified data signal so as to generate a to-be-decoded data signal. The decoder unit is connected to the signal amplifier to receive the to-be-decoded data signal, decodes the to-be-decoded data signal into a decoded signal that is four-bits wide, and includes a three-bit ADC and a comparator. The three-bit ADC performs analog to digital conversion on the to-be-decoded data signal so as to generate a portion of the decoded signal that is three-bits wide. The comparator compares the to-be-decoded data signal with a reference voltage so as to generate another portion of the decoded signal that is one-bit wide.

17 Claims, 4 Drawing Sheets

(56) References Cited

U.S. PATENT DOCUMENTS

| | | | | |
|---|---|---|---|---|
| 2015/0131765 | A1* | 5/2015 | Yoshimoto | H04L 25/03006<br>375/353 |
| 2019/0089466 | A1 | 3/2019 | Li et al. | |
| 2022/0216979 | A1 | 7/2022 | Kim | |
| 2022/0357922 | A1 | 11/2022 | Lee et al. | |

OTHER PUBLICATIONS

Taiwanese Search Report for Taiwanese Application No. 113121000, dated Feb. 25, 2025, with an English translation.

* cited by examiner

DECODER FOR DECODING DATA IN A PAM-10 FORMAT BECAUSE OF 1+0.5D PULSE SHAPING, DECODER DEVICE USING THE DECODER, AND RECEIVER USING THE DECODER DEVICE

FIELD

The disclosure relates to data decoding, and more particularly to a decoder for decoding data in a pulse amplitude modulation (PAM)-10 format because of 1+0.5 D pulse shaping, a decoder device using the decoder, and a receiver using the decoder device.

BACKGROUND

In a mid-reach backplane wireline communication system, data transmission from chip to chip typically involves a channel that is about 25 cm long, which results in a channel loss of about 20 dB. Therefore, extensive equalization techniques are required to be performed at a receiver end to compensate for the channel loss. In addition, clock and data recovery circuitry is also required at the receiver end, so input data can be properly sampled and decoded, thereby achieving a low bit error rate. It is important that a receiver for the mid-reach backplane wireline communication system has enhanced performance and reduced power consumption.

SUMMARY

Therefore, an object of the disclosure is to provide a decoder for decoding data in a pulse amplitude modulation (PAM)-10 format because of 1+0.5 D pulse shaping, a decoder device using the decoder, and a receiver using the decoder device. The receiver can have enhanced performance and reduced power consumption simultaneously.

According to an aspect of the disclosure, the decoder includes a signal amplifier and a decoder unit. The signal amplifier receives a to-be-amplified data signal that originated from an input data signal in a PAM-4 format and that is in a PAM-10 format because of 1+0.5 D pulse shaping, and performs amplification and level shifting on the to-be-amplified data signal so as to generate a to-be-decoded data signal. The decoder unit is connected to the signal amplifier to receive the to-be-decoded data signal, decodes the to-be-decoded data signal into a decoded signal that is four-bits wide, and includes a three-bit analog to digital converter (ADC) and a comparator. The three-bit ADC performs analog to digital conversion on the to-be-decoded data signal so as to generate a portion of the decoded signal that is three-bits wide. The comparator compares the to-be-decoded data signal with a reference voltage so as to generate another portion of the decoded signal that is one-bit wide.

According to another aspect of the disclosure, the decoder device includes a number (N) of decoders, each of which includes a first demultiplexer, a signal amplifier and a number (P) of decoder units, where N≥2 and P≥2. The first demultiplexers of the decoders cooperate with each other to receive a feed-in data signal that originated from an input data signal in a PAM-4 format, and to demultiplex the feed-in data signal into a number (N) of to-be-amplified data signals that are respectively outputted by the first demultiplexers and that are in a PAM-10 format because of 1+0.5 D pulse shaping. For each of the decoders, the signal amplifier is connected to the first demultiplexer to receive the to-be-amplified data signal outputted by the first demultiplexer, and performs amplification and level shifting on the to-be-amplified data signal so as to generate a to-be-decoded data signal; each of the decoder units includes a second demultiplexer, a three-bit ADC and a comparator; and the second demultiplexers of the decoder units are connected to the signal amplifier, and cooperate with each other to receive the to-be-decoded data signal from the signal amplifier, and to demultiplex the to-be-decoded data signal into a number (P) of demultiplexed data signals that are respectively outputted by the second demultiplexers. For each of the decoder units of the decoders, each of the three-bit ADC and the comparator is connected to the second demultiplexer to receive the demultiplexed data signal outputted by the second demultiplexer; and the three-bit ADC and the comparator cooperate with each other to decode the demultiplexed data signal into a decoded signal that is four-bits wide, where the three-bit ADC performs analog to digital conversion on the demultiplexed data signal so as to generate a portion of the decoded signal that is three-bits wide, and the comparator compares the demultiplexed data signal with a reference voltage so as to generate another portion of the decoded signal that is one-bit wide.

According to yet another aspect of the disclosure, the receiver includes a phase interpolator, a decoder device and a processor. The phase interpolator receives a clock input, and performs phase interpolation on the clock input to generate a number (N) of interpolated clock signals, where N≥2 and a phase shift of each of the interpolated clock signals with respect to the clock input is adjustable. The decoder device includes a number (N) of decoders, each of which includes a deskewer, a first demultiplexer, a signal amplifier and a number (P) of decoder units, where P≥2. For each of the decoders, the deskewer is connected to the phase interpolator to receive a respective one of the interpolated clock signals, and delays the respective one of the interpolated clock signals so as to generate a deskewed clock signal; and the first demultiplexer is connected to the deskewer to receive the deskewed clock signal. The first demultiplexers of the decoders cooperate with each other to receive a feed-in data signal that originated from an input data signal in a PAM-4 format, and to demultiplex, based on the deskewed clock signals generated by the deskewers of the decoders, the feed-in data signal into a number (N) of to-be-amplified data signals that are respectively outputted by the first demultiplexers and that are in a PAM-10 format because of 1+0.5 D pulse shaping. For each of the decoders, the signal amplifier is connected to the first demultiplexer to receive the to-be-amplified data signal outputted by the first demultiplexer, and performs amplification and level shifting on the to-be-amplified data signal so as to generate a to-be-decoded data signal; each of the decoder units includes a second demultiplexer, a three-bit ADC and a comparator; and the second demultiplexers of the decoder units are connected to the signal amplifier, and cooperate with each other to receive the to-be-decoded data signal from the signal amplifier, and to demultiplex the to-be-decoded data signal into a number (P) of demultiplexed data signals that are respectively outputted by the second demultiplexers. For each of the decoder units of the decoders, each of the three-bit ADC and the comparator is connected to the second demultiplexer to receive the demultiplexed data signal outputted by the second demultiplexer; and the three-bit ADC and the comparator cooperate with each other to decode the demultiplexed data signal into a decoded signal that is four-bits wide, where the three-bit ADC performs analog to digital conversion on the demultiplexed data signal so as to generate a portion of the decoded signal that is three-bits wide, and the comparator compares the demultiplexed data signal with a reference voltage so as to generate another portion of the decoded signal that is one-bit wide. The processor is connected to the decoder device to receive a decoded output that originated from the decoded signals generated by the three-bit ADCs and the comparators of the decoder units of the decoders, and is further connected to the phase interpolator. Based on the decoded output, the processor generates an output data signal, and performs adaptive calibration on the phase interpolator to adjust the phase shifts of the interpolated clock signals.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
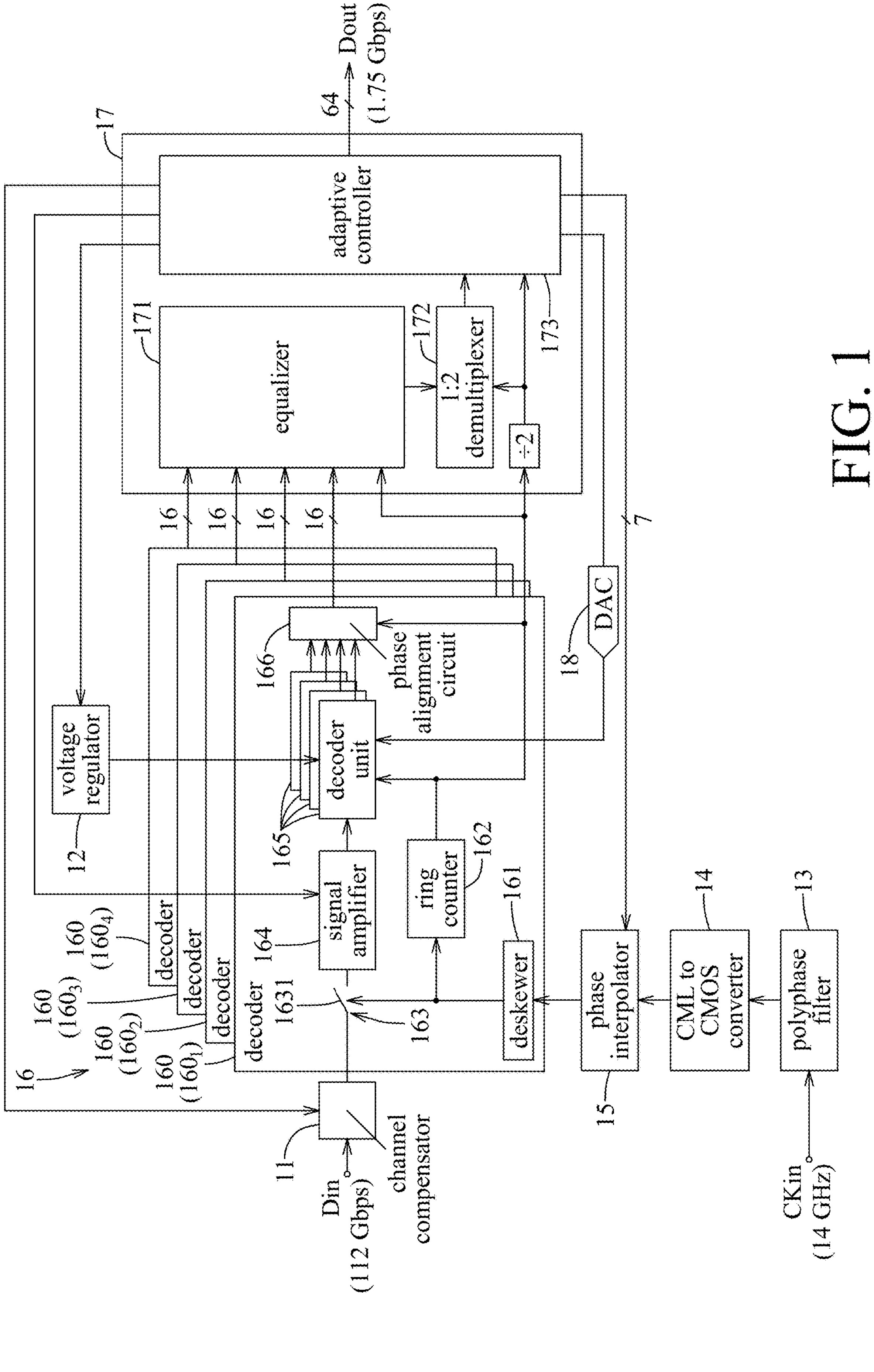
FIG. 1 is a circuit block diagram illustrating an embodiment of a receiver according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
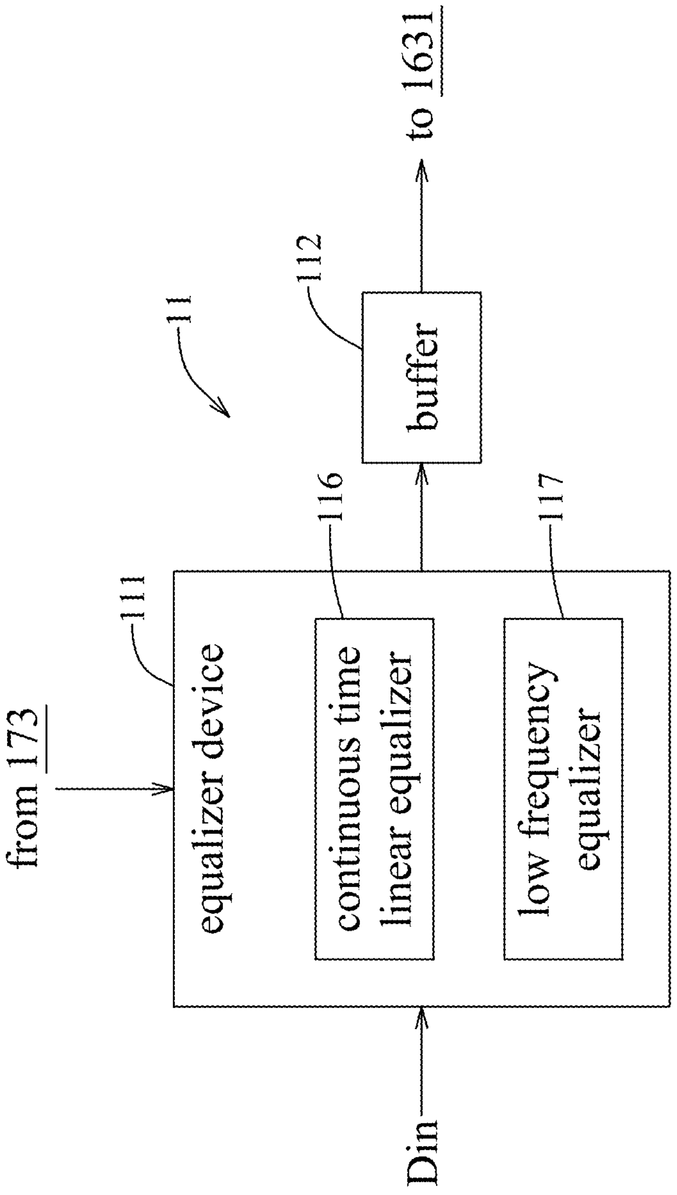
FIG. 2 is a block diagram illustrating a channel compensator of the embodiment.
Figure 3:
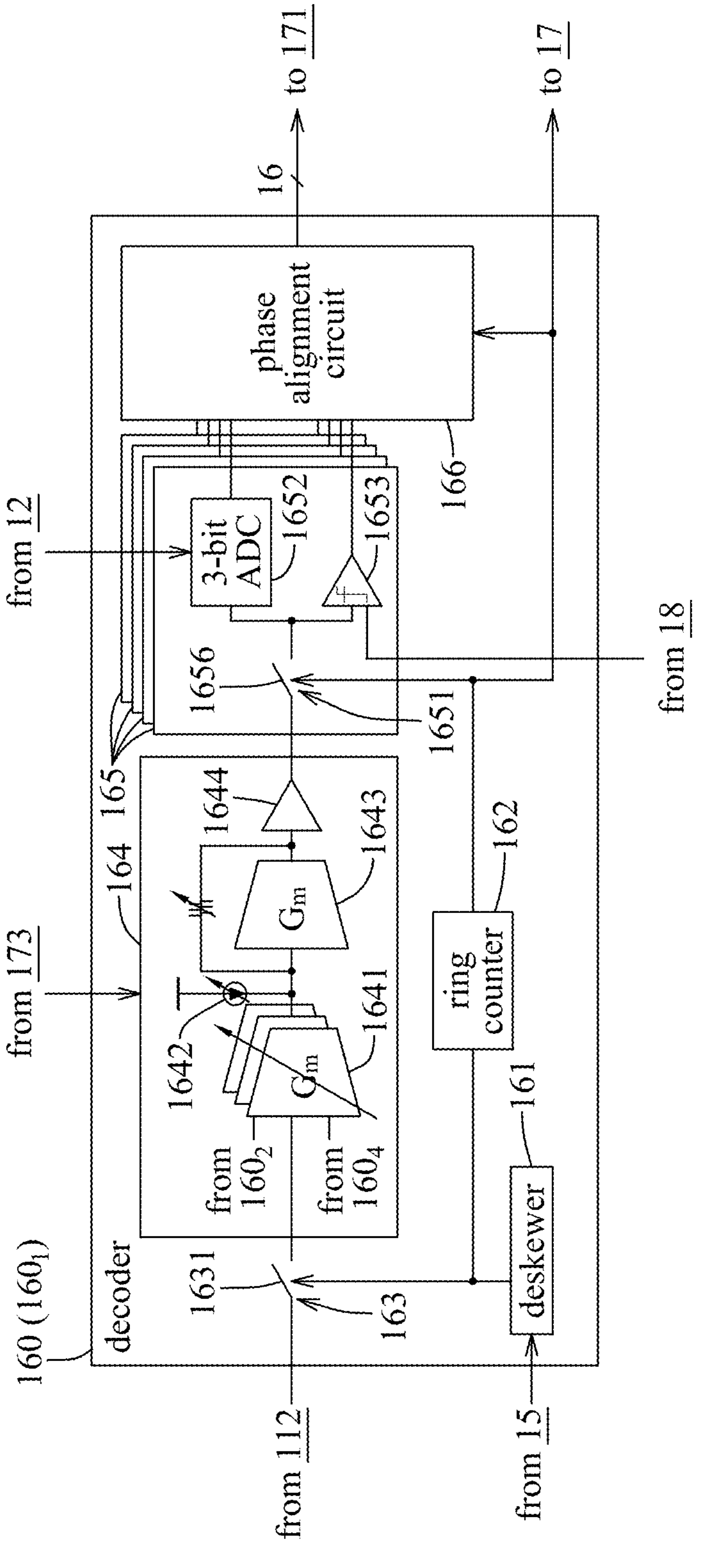
FIG. 3 is a circuit block diagram illustrating a decoder of the embodiment.

Referring to FIGS. 1 to 3, an embodiment of a receiver according to the disclosure is adapted to be used in a mid-reach backplane wireline communication system, and includes a channel compensator 11, a voltage regulator 12, a polyphase filter 13, a current mode logic (CML) to complementary metal oxide semiconductor (CMOS) converter 14, a phase interpolator 15, a decoder device 16, a processor 17 and a digital to analog converter (DAC) 18.

The channel compensator 11 receives an input data signal (Din) that is in a pulse amplitude modulation (PAM)-4 format, and performs channel compensation on the input data signal (Din) to generate a feed-in data signal, where a gain of the channel compensator 11 is adjustable. The input data signal (Din) contains a plurality of samples that are sequentially arranged in time. For illustration purposes, in this embodiment, each of the input data signal (Din) and the feed-in data signal has a data rate of 112 Gbps (i.e., 56 Gbaud).

In this embodiment, the channel compensator 11 includes an equalizer device 111 and a buffer 112. The equalizer device 111 includes a continuous time linear equalizer (CTLE) 116 and a low frequency equalizer (LFEQ) 117. High frequency components of the input data signal (Din) are compensated by the continuous time linear equalizer 116, medium and low frequency components of the input data signal (Din) are compensated by the low frequency equalizer 117, and a resultant signal from the aforesaid compensations is buffered by the buffer 112 so as to generate the feed-in data signal. Parameters of the continuous time linear equalizer 116 and the low frequency equalizer 117 can be adjusted to change the gain of the channel compensator 11.

The voltage regulator 12 generates a first reference voltage having a magnitude that is adjustable.

The polyphase filter 13 receives a differential input clock signal pair (CKin) of a CML level, and splits the differential input clock signal pair (CKin) into two differential first clock signal pairs that are of the CML level and that are 90 degrees out of phase. For illustration purposes, in this embodiment, the differential input clock signal pair (CKin) has a frequency of 14 GHz.

The CML to CMOS converter 14 is connected to the polyphase filter 13 to receive the differential first clock signal pairs, and converts the differential first clock signal pairs respectively into two differential second clock signal pairs of a CMOS level.

The phase interpolator 15 cooperates with some components of the processor 17 to constitute a clock data recovery (CDR) circuit. The phase interpolator 15 is connected to the CML to CMOS converter 14 to receive the differential second clock signal pairs that cooperatively constitute a clock input, and performs phase interpolation on the clock input to generate a number (N) of interpolated clock signals, where N≥2. A phase shift of each of the interpolated clock signals with respect to the clock input is adjustable. For illustration purposes, in this embodiment, four interpolated clock signals are generated (i.e., N=4).

The decoder device 16 includes a number (N) of decoders 160 (i.e., there are four decoders 160 including a first decoder $\mathbf{160_1}$, a second decoder $\mathbf{160_2}$, a third decoder $\mathbf{160_3}$ and a fourth decoder $\mathbf{160_4}$ in this embodiment). In this embodiment, each of the decoders 160 includes a deskewer 161, a ring counter 162, a first demultiplexer 163, a signal amplifier 164, a number (P) of decoder units 165 and a phase alignment circuit 166, where P≥2. For illustration purposes, in this embodiment, four decoder units 165 are used (i.e., P=4).

For each of the decoders 160, the deskewer 161 is connected to the phase interpolator 15 to receive a respective one of the interpolated clock signals, and delays the respective one of the interpolated clock signals to generate a deskewed clock signal. The first demultiplexer 163 is connected to the deskewer 161 to receive the deskewed clock signal, and is further connected to the buffer 112.

The first demultiplexers 163 of the decoders 160 cooperate with each other to receive the feed-in data signal from the buffer 112, and to demultiplex, based on the deskewed clock signals generated by the deskewers 161 of the decoders 160, the feed-in data signal into a number (N) of to-be-amplified data signals (i.e., there are four to-be-amplified data signals in this embodiment) that are respectively outputted by the first demultiplexers 163 and that are in a PAM-10 format because of 1+0.5 D pulse shaping. In this embodiment, each of the to-be-amplified data signals has a data rate of 14 Gbaud.

In this embodiment, for each of the decoders 160, the first demultiplexer 163 includes a sampling switch 1631. The sampling switch 1631 has a first terminal that is connected to the buffer 112 to receive the feed-in data signal, a second terminal that provides the corresponding one of the to-be-amplified data signals, and a control terminal that is connected to the deskewer 161 to receive the deskewed clock signal. The sampling switch 1631 switches between conduction and non-conduction based on the deskewed clock signal. When the sampling switch 1631 conducts, the feed-in data signal is transmitted through the sampling switch 1631 to serve as the corresponding one of the to-be-amplified data signals.

For each of the decoders 160, the ring counter 162 is connected to the deskewer 161 to receive the deskewed clock signal, and generates, based on the deskewed clock signal, a counting output that is P-bits wide (i.e., four-bits wide in this embodiment). A predetermined logic value (e.g., logic value "1") circulates around the bits of the counting output at the pace defined by the deskewed clock signal.

For each of the decoders 160, the signal amplifier 164 is connected to the second terminal of the sampling switch 1631 to receive the to-be-amplified data signal, and performs amplification and level shifting on the to-be-amplified data signal so as to generate a to-be-decoded data signal. A gain and a shift amount of the signal amplifier 164 are adjustable. In this embodiment, the signal amplifier 164 includes a transadmittance amplifier circuit 1641, a current source 1642, a transimpedance amplifier circuit 1643 and a buffer 1644. The transadmittance amplifier circuit 1641 is, for example, a three-tap feedforward equalizer, is connected to the second terminals of the sampling switches 1631 of the decoder 160 and two other decoders 160 to receive the to-be-amplified data signals, and performs voltage to current conversion and amplification on the to-be-amplified data signal received from the sampling switch 1631 of the decoder 160 based on the to-be-amplified data signals received from the sampling switches 1631 of the two other decoders 160 so as to generate a first current signal. The current source 1642 generates a second current signal. The transimpedance amplifier circuit 1643 is connected to the transadmittance amplifier circuit 1641 and the current source 1642 to receive the first current signal and the second current signal, and performs current to voltage conversion and amplification on a combination of the first current signal and the second current signal so as to generate an amplified data signal. The buffer 1644 is connected to the transimpedance amplifier circuit 1643 to receive the amplified data signal, and buffers the amplified data signal so as to generate the to-be-decoded data signal. Parameters of the transadmittance amplifier circuit 1641 and the transimpedance amplifier circuit 1643 can be adjusted to change the gain of the signal amplifier 164. Parameters of the current source 1642 can be adjusted to change the shift amount of the signal amplifier 164.

In an example, the transadmittance amplifier circuit 1641 of the first decoder $\mathbf{160_1}$ is connected to the second terminals of the sampling switches 1631 of the first, second and fourth decoders $\mathbf{160_1}$, $\mathbf{160_2}$, $\mathbf{160_4}$ to receive the to-be-amplified data signals, and performs voltage to current conversion and amplification on the to-be-amplified data signal received from the sampling switch 1631 of the first decoder $\mathbf{160_1}$ based on the to-be-amplified data signals received from the sampling switches 1631 of the second and fourth decoders $\mathbf{160_2}$, $\mathbf{160_4}$; the transadmittance amplifier circuit 1641 of the second decoder $\mathbf{160_2}$ is connected to the second terminals of the sampling switches 1631 of the first, second and third decoders $\mathbf{160_1}$, $\mathbf{160_2}$, $\mathbf{160_3}$ to receive the to-be-amplified data signals, and performs voltage to current conversion and amplification on the to-be-amplified data signal received from the sampling switch 1631 of the second decoder $\mathbf{160_2}$ based on the to-be-amplified data signals received from the sampling switches 1631 of the first and third decoders $\mathbf{160_1}$, $\mathbf{160_3}$; the transadmittance amplifier circuit 1641 of the third decoder $\mathbf{160_3}$ is connected to the second terminals of the sampling switches 1631 of the second, third and fourth decoders $\mathbf{160_2}$, $\mathbf{160_3}$, $\mathbf{160_4}$ to receive the to-be-amplified data signals, and performs voltage to current conversion and amplification on the to-be-amplified data signal received from the sampling switch 1631 of the third decoder $\mathbf{160_3}$ based on the to-be-amplified data signals received from the sampling switches 1631 of the second and fourth decoders $\mathbf{160_2}$, $\mathbf{160_4}$; and the transadmittance amplifier circuit 1641 of the fourth decoder $\mathbf{160_4}$ is connected to the second terminals of the sampling switches 1631 of the first, third and fourth decoders $\mathbf{160_1}$, $\mathbf{160_3}$, $\mathbf{160_4}$ to receive the to-be-amplified data signals, and performs voltage to current conversion and amplification on the to-be-amplified data signal received from the sampling switch 1631 of the fourth decoder $\mathbf{160_4}$ based on the to-be-amplified data signals received from the sampling switches 1631 of the first and third decoders $\mathbf{160_1}$, $\mathbf{160_3}$.

Each of the to-be-decoded data signals generated by the signal amplifiers 164 of the decoders 160 contains a plurality of samples. The samples of the to-be-decoded data signals respectively correspond to the samples of the input data signal (Din). The signal amplifiers 164 of the decoders 160 operate one by one cyclically at a pace defined by a frequency that is a number (N) of times (i.e., four times in this embodiment) a frequency of each of the interpolated clock signals, so as to generate the samples of the to-be-decoded data signals sequentially.

Each of the decoder units 165 of the decoders 160 includes a second demultiplexer 1651, a three-bit analog to digital converter (ADC) 1652 and a comparator 1653.

For each of the decoders 160, the second demultiplexers 1651 of the decoder units 165 are connected to the ring counter 162 and the buffer 1644, and cooperate with each other to receive the counting output from the ring counter 162, to receive the to-be-decoded data signal from the buffer 1644, and to demultiplex, based on the counting output, the to-be-decoded data signal into a number (P) of demultiplexed data signals (i.e., there are four demultiplexed data signals in this embodiment) that are respectively outputted by the second demultiplexers 1651. In this embodiment, each of the demultiplexed data signals has a data rate of 3.5 Gbaud.

In this embodiment, for each of the decoders 160, the second demultiplexer 1651 of each of the decoder units 165 includes a sampling switch 1656 having a first terminal that is connected the buffer 1644 to receive the to-be-decoded data signal, a second terminal that provides the corresponding one of the demultiplexed data signals, and a control terminal that is connected to the ring counter 162 to receive a respective one of the bits of the counting output. For each of the decoder units 165 of the decoders 160, the sampling switch 1656 conducts when the respective one of the bits of the counting output is at the predetermined logic value (i.e., the logic value "1" in this embodiment), and does not conduct when otherwise; and when the sampling switch 1656 conducts, the to-be-decoded data signal is transmitted through the sampling switch 1656 to serve as the corresponding one of the demultiplexed data signals.

For each of the decoder units 165 of the decoders 160, each of the three-bit ADC 1652 and the comparator 1653 is connected to the second terminal of the sampling switch 1656 to receive the demultiplexed data signal. The three-bit ADC 1652 and the comparator 1653 cooperate with each other to decode the demultiplexed data signal into a decoded signal that is four-bits wide. The three-bit ADC 1652 is further connected to the voltage regulator 12 to receive the first reference voltage, and performs analog to digital conversion on the demultiplexed data signal based on the first reference voltage so as to generate a portion of the decoded signal that is three-bits wide. The comparator 1653 is further connected to the DAC 18 to receive a second reference voltage, and compares the demultiplexed data signal with the second reference voltage so as to generate another portion of the decoded signal that is one-bit wide.

In this embodiment, each of the decoded signals generated by the three-bit ADCs 1652 and the comparators 1653 of the decoder units 165 of the decoders 160 contains a plurality of samples. The decoder units 165 of the decoders 160 operate one by one cyclically at a pace defined by a frequency that is a number (N) of times (i.e., four times in this embodiment) the frequency of each of the interpolated clock signals, so as to generate the samples of the decoded signals sequentially.

Figure 4:
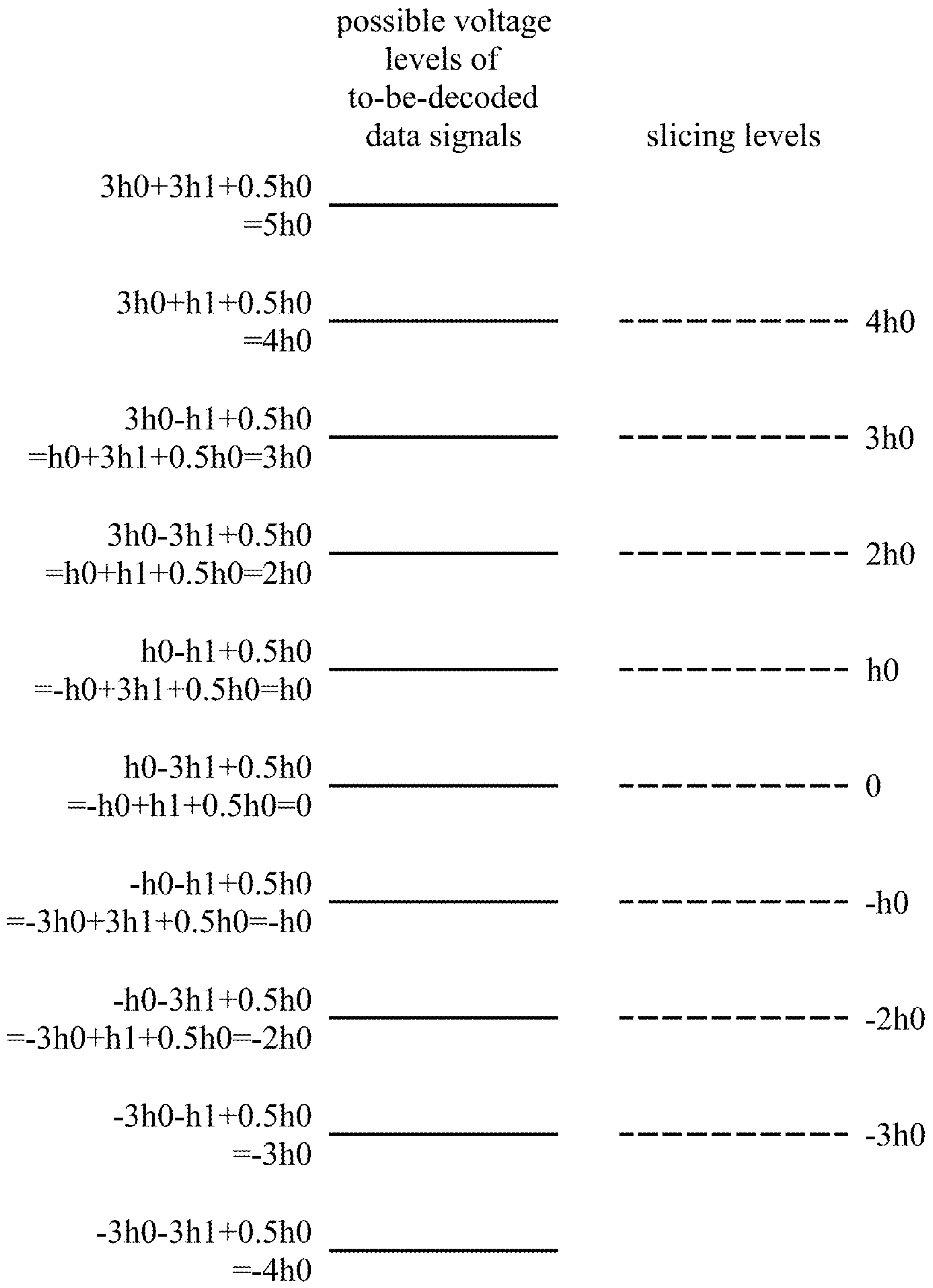
FIG. 4 is a schematic diagram illustrating possible voltage levels of to-be-decoded data signals and slicing levels of the embodiment.

In this embodiment, as shown in FIG. 4, for each of the decoder units 165 of the decoders 160, the three-bit ADC 1652 and the comparator 1653 cooperate with each other to provide eight slicing levels of about −3×h0, −2×h0, −1×h0, 0, 1×h0, 2×h0, 3×h0 and 4×h0. The largest one of the slicing levels (i.e., 4×h0) is provided by the comparator 1653, and is equal to a magnitude of the second reference voltage. The other ones of the slicing levels are provided by the three-bit ADC 1652 based on the first reference voltage. Each of the samples of the to-be-decoded data signals has a voltage level of about (a×h0+b×h1+0.5×h0), where "a×h0" is attributed to a first sample of the input data signal (Din) that corresponds to the sample of the to-be-decoded data signals, "a" is a digital value of "−3", "−1", "1" or "3" that represents the first sample of the input data signal (Din), "b×h1" is attributed to a second sample of the input data signal (Din) that is arranged immediately before the first sample of the input data signal (Din), "b" is a digital value of "−3", "−1", "1" or "3" that represents the second sample of the input data signal (Din), h1=0.5×h0 because of the 1+0.5 D pulse shaping, and "0.5×h0" is the shift amount attributed to the second current signal. Therefore, there are ten possible voltage levels of about −4×h0, −3×h0, −2×h0, −1×h0, 0, 1×h0, 2×h0, 3×h0, 4×h0 and 5×h0 for each of the samples of the to-be-decoded data signals. For each of the samples of the to-be-decoded data signals, when b=−3, the possible voltage levels of the sample are about −4×h0, −2×h0, 0 and 2×h0, and can be discriminated using the slicing levels of about −3×h0, −1×h0 and 1×h0; when b=−1, the possible voltage levels of the sample are about −3×h0, −1×h0, 1×h0 and 3×h0, and can be discriminated using the slicing levels of about −2×h0, 0 and 2×h0; when b=1, the possible voltage levels of the sample are about −2×h0, 0, 2×h0 and 4×h0, and can be discriminated using the slicing levels of about −1×h0, 1×h0 and 3×h0; and when b=3, the possible voltage levels of the sample are about −1×h0, 1×h0, 3×h0 and 5×h0, and can be discriminated using the slicing levels of about 0, 2×h0 and 4×h0.

For each of the decoders 160, the phase alignment circuit 166 is connected to the three-bit ADCs 1652 and the comparators 1653 of the decoder units 165 to receive the decoded signals generated by the three-bit ADCs 1652 and the comparators 1653, is further connected to the ring counter 162 to receive the counting output, and aligns the decoded signals based on the counting output so as to generate an aligned signal that is (4×P)-bits wide (i.e., sixteen-bits wide in this embodiment). The aligned signals generated by the phase alignment circuits 166 of the decoders 160 cooperatively constitute a decoded output that is (4×N×P)-bits wide (i.e., sixty-four-bits wide in this embodiment).

The processor 17 is connected to the phase alignment circuits 166 of the decoders 160 to receive the decoded output, and is further connected to the equalizer device 111, the voltage regulator 12, the phase interpolator 15, the signal amplifiers 164 of the decoders 160, and the DAC 18. Based on the decoded output, the processor 17 generates an output data signal (Dout), and performs adaptive calibration on the equalizer device 111, the voltage regulator 12, the phase interpolator 15, the signal amplifiers 164 of the decoders 160, and the DAC 18 to adjust the gain of the channel compensator 11, the magnitude of the first reference voltage, the phase shifts of the interpolated clock signals, the gains and the shift amounts of the signal amplifiers 164 of the decoders 160, and the magnitude of the second reference voltage so as to obtain an optimal quality of each to-be-decoded data signal's eye diagram, a correct swing of each to-be-decoded data signal, and optimal sample positions of the feed-in data signal.

In this embodiment, the processor 17 includes an equalizer 171, a 1:Q demultiplexer 172 and an adaptive controller 173. For illustration purposes, in this embodiment, a 1:2 demultiplexer 172 is used (i.e., Q=2).

The equalizer 171 is connected to the phase alignment circuits 166 of the decoders 160 to receive the decoded output, and converts the decoded output into a conversion output that is (3×N×P)-bits wide (i.e., forty-eight-bits wide in this embodiment) and that contains a plurality of samples. The samples of the conversion output respectively correspond to the samples of the decoded signals generated by the decoder units 165 of the decoders 160, and are generated sequentially. Each of the samples of the conversion output contains a data portion that is two-bits wide and that is in a non-return-to-zero (NRZ) format, and an error portion that is one-bit wide. The data portion is at one of a logic value "00" (corresponding to a digital value of "0"), a logic value "01" (corresponding to a digital value of "1"), a logic value "10" (corresponding to a digital value of "2") and a logic value "11" (corresponding to a digital value of "3"). The error portion is at one of a logic value "0" and a logic value "1". In this embodiment, the equalizer 171 is a look-ahead decision feedback equalizer, and each of the samples of the conversion output is generated based on the sample of the decoded signals that corresponds to the sample of the conversion output and on another sample of the conversion output that is generated immediately before the generation of the sample of the conversion output.

The 1:Q demultiplexer 172 (i.e., the 1:2 demultiplexer 172 in this embodiment) is connected to the equalizer 171 to receive the conversion output, and demultiplexes the conversion output into a demultiplexed output having a bit width that is Q times (i.e., twice in this embodiment) a bit width of the conversion output. That is, the demultiplexed output is (3×N×P×Q)-bits wide (i.e., ninety-six-bits wide in this embodiment).

The adaptive controller 173 is connected to the 1:Q demultiplexer 172 (i.e., the 1:2 demultiplexer 172 in this embodiment) to receive the demultiplexed output, is further connected to the equalizer device 111, the voltage regulator 12, the phase interpolator 15, the signal amplifiers 164 of the decoders 160, and the DAC 18, and generates the output data signal (Dout) based on a portion of the demultiplexed output that originated from the data portions of the samples of the conversion output. The output data signal (Dout) is (2×N×P×Q)-bits wide (i.e., sixty-four-bits wide in this embodiment). The adaptive controller 173 further performs adaptive calibration on the equalizer device 111, the voltage regulator 12, the phase interpolator 15, the signal amplifiers 164 of the decoders 160, and the DAC 18 to adjust the gain of the channel compensator 11, the magnitude of the first reference voltage, the phase shifts of the interpolated clock signals, the gains and the shift amounts of the signal amplifiers 164 of the decoders 160, and the magnitude of the second reference voltage based on the demultiplexed output. In this embodiment, the output data signal (Dout) has a data rate of 64×1.75 Gbps.

In this embodiment, as shown in Tables 1 and 2 below, the adaptive controller 173 performs adaptive calibration on the phase interpolator 15 to adjust the phase shifts of the interpolated clock signals with reference to the data portion (D[n]) and the error portion (E[n]) of a first sample of the conversion output and the data portion (D[n−1]) of a second sample of the conversion output that is generated immediately before the generation of the first sample of the conversion output.

TABLE 1

| D[n − 1], D[n] | E[n] | Phase |
|---|---|---|
| D[n] < D[n − 1] | 1 | Defer |
| D[n] < D[n − 1] | 0 | Advance |
| D[n] > D[n − 1] | 1 | Advance |
| D[n] > D[n − 1] | 0 | Defer |

TABLE 2

| D[n − 1], D[n] | E[n] | Phase |
|---|---|---|
| (D[n] = 3) and (D[n − 1] = 0 or 1) | 1 | Advance |
| | 0 | Defer |
| (D[n] = 1 or 2) and (D[n − 1] = 3) | 1 | Defer |
| | 0 | Advance |
| (D[n] = 1 or 2) and (D[n − 1] = 0) | 1 | Advance |
| | 0 | Defer |
| (D[n] = 0) and (D[n − 1] = 2 or 3) | 1 | Defer |
| | 0 | Advance |

In this embodiment, the adaptive controller 173 selectively operates in one of two modes that includes a first calibration mode and a second calibration.

In the first calibration mode, as shown in Table 1, the adaptive controller 173 adjusts the phase shifts of the interpolated clock signals to defer phases of the interpolated clock signals when any one of the following conditions is met: (a) a digital value representing the data portion (D[n]) of the first sample of the conversion output is smaller than a digital value representing the data portion (D[n−1]) of the second sample of the conversion output, and the error portion (E[n]) of the first sample of the conversion output is at a logic value "1"; and (b) the digital value representing the data portion (D[n]) of the first sample of the conversion output is larger than the digital value representing the data portion (D[n−1]) of the second sample of the conversion output, and the error portion (E[n]) of the first sample of the conversion output is at a logic value "0". In addition, the adaptive controller 173 adjusts the phase shifts of the interpolated clock signals to advance the phases of the Interpolated clock signals when any one of the following conditions is met: (a) the digital value representing the data portion (D[n]) of the first sample of the conversion output is smaller than the digital value representing the data portion (D[n−1]) of the second sample of the conversion output, and the error portion (E[n]) of the first sample of the conversion output is at a logic value "0"; and (b) the digital value representing the data portion (D[n]) of the first sample of the conversion output is larger than the digital value representing the data portion (D[n−1]) of the second sample of the conversion output, and the error portion (E[n]) of the first sample of the conversion output is at a logic value "1". Otherwise, the adaptive controller 173 keeps the phase shifts of the interpolated clock signals unchanged.

In the second calibration mode, as shown in Table 2, the adaptive controller 173 adjusts the phase shifts of the interpolated clock signals to defer the phases of the interpolated clock signals when any one of the following conditions is met: (a) the data portion (D[n]) of the first sample of the conversion output is represented by a digital value of "3", the data portion (D[n−1]) of the second sample of the conversion output is represented by a digital value of "0" or "1", and the error portion (E[n]) of the first sample of the conversion output is at a logic value "0"; (b) the data portion (D[n]) of the first sample of the conversion output is represented by a digital value of "1" or "2", the data portion (D[n−1]) of the second sample of the conversion output is represented by a digital value of "3", and the error portion (E[n]) of the first sample of the conversion output is at a logic value "1"; (c) the data portion (D[n]) of the first sample of the conversion output is represented by a digital value of "1" or "2", the data portion (D[n−1]) of the second sample of the conversion output is represented by a digital value of "0", and the error portion (E[n]) of the first sample of the conversion output is at a logic value "0"; and (d) the data portion (D[n]) of the first sample of the conversion output is represented by a digital value of "0", the data portion (D[n−1]) of the second sample of the conversion output is represented by a digital value of "2" or "3", and the error portion (E[n]) of the first sample of the conversion output is at a logic value "1". In addition, the processor 173 adjusts the phase shifts of the interpolated clock signals to advance the phases of the Interpolated clock signals when any one of the following conditions is met: (a) the data portion (D[n]) of the first sample of the conversion output is represented by a digital value of "3", the data portion (D[n−1]) of the second sample of the conversion output is represented by a digital value of "0" or "1", and the error portion (E[n]) of the first sample of the conversion output is at a logic value "1"; (b) the data portion (D[n]) of the first sample of the conversion output is represented by a digital value of "1" or "2", the data portion (D[n−1]) of the second sample of the conversion output is represented by a digital value of "3", and the error portion (E[n]) of the first sample of the conversion output is at a logic in value "0"; (c) the data portion (D[n]) of the first sample of the conversion output is represented by a digital value of "1" or "2", the data portion (D[n−1]) of the second sample of the conversion output is represented by a digital value of "0", and the error portion (E[n]) of the first sample of the conversion output is at a logic value "1"; and (d) the data portion (D[n]) of the first sample of the conversion output is represented by a digital value of "0", the data portion (D[n−1]) of the second sample of the conversion output is represented by a digital value of "2" or "3", and the error portion (E[n]) of the first sample of the conversion output is at a logic value "0". Otherwise, the adaptive controller 173 keeps the phase shifts of the interpolated clock signals unchanged.

In view of the above, the receiver of this embodiment has the following advantages.

1. By virtue of the adaptive controller 173 performing the adaptive calibration on the equalizer device 111, the voltage regulator 12, the phase interpolator 15, the signal amplifiers 164 of the decoders 160, and the DAC 18, the receiver can deal with channel loss, and process, voltage and temperature (PVT) variations, thereby operating more stably and achieving a higher yield.

2. By virtue of the first multiplexers 163 and the second multiplexers 1651 of the decoders 160, the signal amplifiers 164, the three-bit ADCs 1652 and the comparators 1653 of the decoders 160 can operate at lower frequencies, thereby reducing power consumption of the receiver.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A decoder comprising:

a signal amplifier receiving a to-be-amplified data signal that originated from an input data signal in a pulse amplitude modulation (PAM)-4 format and that is in a PAM-10 format because of 1+0.5 D pulse shaping, and performing amplification and level shifting on the to-be-amplified data signal so as to generate a to-be-decoded data signal; and a decoder unit connected to said signal amplifier to receive the to-be-decoded data signal, decoding the to-be-decoded data signal into a decoded signal that is four-bits wide, and including a three-bit analog to digital converter (ADC) performing analog to digital conversion on the to-be-decoded data signal so as to generate a portion of the decoded signal that is three-bits wide; and a comparator comparing the to-be-decoded data signal with a reference voltage so as to generate another portion of the decoded signal that is one-bit wide.

2. The decoder as claimed in claim 1, wherein said signal amplifier includes:

a transadmittance amplifier circuit receiving the to-be-amplified data signal, and performing voltage to current conversion and amplification on the to-be-amplified data signal so as to generate a first current signal;

a current source generating a second current signal; and a transimpedance amplifier circuit connected to said transadmittance amplifier circuit and said current source to receive the first current signal and the second current signal, and performing current to voltage conversion and amplification on a combination of the first current signal and the second current signal so as to generate an amplified data signal related to the to-be-decoded data signal.

3. The decoder as claimed in claim 2, wherein said signal amplifier further includes a buffer that is connected to said transimpedance amplifier circuit and said decoder unit, that receives the amplified data signal from said transimpedance amplifier circuit, and that buffers the amplified data signal so as to generate the to-be-decoded data signal for receipt by said decoder unit.

4. A decoder device comprising:

a number (N) of decoders, each of which includes a first demultiplexer, a signal amplifier and a number (P) of decoder units, where N≥2 and P≥2;

said first demultiplexers of said decoders cooperating with each other to receive a feed-in data signal that originated from an input data signal in a pulse amplitude modulation (PAM)-4 format, and to demultiplex the feed-in data signal into a number (N) of to-be-amplified data signals that are respectively outputted by said first demultiplexers and that are in a PAM-10 format because of 1+0.5 D pulse shaping;

for each of said decoders, said signal amplifier being connected to said first demultiplexer to receive the to-be-amplified data signal outputted by said first demultiplexer, and performing amplification and level shifting on the to-be-amplified data signal so as to generate a to-be-decoded data signal, each of said decoder units including a second demultiplexer, a three-bit analog to digital converter (ADC) and a comparator, and said second demultiplexers of said decoder units being connected to said signal amplifier, and cooperating with each other to receive the to-be-decoded data signal from said signal amplifier, and to demultiplex the to-be-decoded data signal into a number (P) of demultiplexed data signals that are respectively outputted by said second demultiplexers; and for each of said decoder units of said decoders, each of said three-bit ADC and said comparator being connected to said second demultiplexer to receive the demultiplexed data signal outputted by said second demultiplexer, and said three-bit ADC and said comparator cooperating with each other to decode the demultiplexed data signal into a decoded signal that is four-bits wide, where said three-bit ADC performs analog to digital conversion on the demultiplexed data signal so as to generate a portion of the decoded signal that is three-bits wide, and said comparator compares the demultiplexed data signal with a reference voltage so as to generate another portion of the decoded signal that is one-bit wide.

5. The decoder device as claimed in claim 4, wherein, for each of said decoders, said signal amplifier includes:

a transadmittance amplifier circuit connected to said first demultiplexer to receive the to-be-amplified data signal, and performing voltage to current conversion and amplification on the to-be-amplified data signal so as to generate a first current signal;

a current source generating a second current signal; and a transimpedance amplifier circuit connected to said transadmittance amplifier circuit and said current source to receive the first current signal and the second current signal, and performing current to voltage conversion and amplification on a combination of the first current signal and the second current signal so as to generate an amplified data signal related to the to-be-decoded data signal.

6. The decoder device as claimed in claim 5, wherein, for each of said decoders, said signal amplifier further includes a buffer that is connected to said transimpedance amplifier circuit and said second demultiplexers of said decoder units, that receives the amplified data signal from said transimpedance amplifier circuit, and that buffers the amplified data signal so as to generate the to-be-decoded data signal for receipt by said second demultiplexers.

7. The decoder device as claimed in claim 4, wherein, for each of said decoders:

said second demultiplexer of each of said decoder units includes a sampling switch; and said sampling switch of said second demultiplexer of each of said decoder units has a first terminal that is connected said signal amplifier to receive the to-be-decoded data signal, and a second terminal that is connected to said three-bit ADC and said comparator of said decoder unit and that provides the corresponding one of the demultiplexed data signals.

8. The decoder device as claimed in claim 4, wherein, for each of said decoders:

said first demultiplexer includes a sampling switch;

said sampling switch has a first terminal that receives the feed-in data signal, and a second terminal that is connected to said signal amplifier and that provides the corresponding one of the to-be-amplified data signals.

9. The decoder device as claimed in claim 4, wherein:

each of said decoders further includes a phase alignment circuit; and for each of said decoders, said phase alignment circuit is connected to said three-bit ADCs and said comparators of said decoder units to receive the decoded signals generated by said three-bit ADCs and said comparators, and aligning the decoded signals so as to generate an aligned signal that is (4×P)-bits wide.

10. A receiver comprising:

a phase interpolator receiving a clock input, and performing phase interpolation on the clock input to generate a number (N) of interpolated clock signals, where N≥2 and a phase shift of each of the interpolated clock signals with respect to the clock input is adjustable;

a decoder device including a number (N) of decoders, each of which includes a deskewer, a first demultiplexer, a signal amplifier and a number (P) of decoder units, where P≥2;

for each of said decoders, said deskewer being connected to said phase interpolator to receive a respective one of the interpolated clock signals, and delaying the respective one of the interpolated clock signals so as to generate a deskewed clock signal, and said first demultiplexer being connected to said deskewer to receive the deskewed clock signal;

said first demultiplexers of said decoders cooperating with each other to receive a feed-in data signal that originated from an input data signal in a pulse amplitude modulation (PAM)-4 format, and to demultiplex, based on the deskewed clock signals generated by said deskewers of said decoders, the feed-in data signal into a number (N) of to-be-amplified data signals that are respectively outputted by said first demultiplexers and that are in a PAM-10 format because of 1+0.5 D pulse shaping;

for each of said decoders, said signal amplifier being connected to said first demultiplexer to receive the to-be-amplified data signal outputted by said first demultiplexer, and performing amplification and level shifting on the to-be-amplified data signal so as to generate a to-be-decoded data signal, each of said decoder units including a second demultiplexer, a three-bit analog to digital converter (ADC) and a comparator, and said second demultiplexers of said decoder units being connected to said signal amplifier, and cooperating with each other to receive the to-be-decoded data signal from said signal amplifier, and to demultiplex the to-be-decoded data signal into a number (P) of demultiplexed data signals that are respectively outputted by said second demultiplexers;

for each of said decoder units of said decoders, each of said three-bit ADC and said comparator being connected to said second demultiplexer to receive the demultiplexed data signal outputted by said second demultiplexer, and said three-bit ADC and said comparator cooperating with each other to decode the demultiplexed data signal into a decoded signal that is four-bits wide, where said three-bit ADC performs analog to digital conversion on the demultiplexed data signal so as to generate a portion of the decoded signal that is three-bits wide, and said comparator compares the demultiplexed data signal with a reference voltage so as to generate another portion of the decoded signal that is one-bit wide; and a processor connected to said decoder device to receive a decoded output that originated from the decoded signals generated by said three-bit ADCs and said comparators of said decoder units of said decoders, and further connected to said phase interpolator;

based on the decoded output, said processor generating an output data signal, and performing adaptive calibration on said phase interpolator to adjust the phase shifts of the interpolated clock signals.

11. The receiver as claimed in claim 10, wherein:

said processor converts the decoded output into a conversion output that contains a plurality of samples;

the samples of the conversion output are generated sequentially;

each of the samples of the conversion output contains a data portion that is two-bits wide and an error portion that is one-bit wide;

said processor performs adaptive calibration on said phase interpolator to adjust the phase shifts of the interpolated clock signals with reference to the data portion and the error portion of a first sample of the conversion output and the data portion of a second sample of the conversion output that is generated immediately before the generation of the first sample of the conversion output.

12. The receiver as claimed in claim 11, wherein said processor adjusts the phase shifts of the interpolated clock signals to defer phases of the Interpolated clock signals when any one of the following conditions is met:

a digital value representing the data portion of the first sample of the conversion output is smaller than a digital value representing the data portion of the second sample of the conversion output, and the error portion of the first sample of the conversion output is at a logic value “1”; and the digital value representing the data portion of the first sample of the conversion output is larger than the digital value representing the data portion of the second sample of the conversion output, and the error portion of the first sample of the conversion output is at a logic value “0”.

13. The receiver as claimed in claim 11, wherein said processor adjusts the phase shifts of the interpolated clock signals to advance phases of the Interpolated clock signals when any one of the following conditions is met:

a digital value representing the data portion of the first sample of the conversion output is smaller than a digital value representing the data portion of the second sample of the conversion output, and the error portion of the first sample of the conversion output is at a logic value “0”; and the digital value representing the data portion of the first sample of the conversion output is larger than the digital value representing the data portion of the second sample of the conversion output, and the error portion of the first sample of the conversion output is at a logic value “1”.

14. The receiver as claimed in claim 11, wherein said processor adjusts the phase shifts of the interpolated clock signals to defer phases of the Interpolated clock signals when any one of the following conditions is met:

the data portion of the first sample of the conversion output is represented by a digital value of “3”, the data portion of the second sample of the conversion output is represented by a digital value of “0” or “1”, and the error portion of the first sample of the conversion output is at a logic value “0”;

the data portion of the first sample of the conversion output is represented by a digital value of “1” or “2”, the data portion of the second sample of the conversion output is represented by a digital value of “3”, and the error portion of the first sample of the conversion output is at a logic value “1”;

the data portion of the first sample of the conversion output is represented by a digital value of “1” or “2”, the data portion of the second sample of the conversion output is represented by a digital value of “0”, and the error portion of the first sample of the conversion output is at a logic value “0”; and the data portion of the first sample of the conversion output is represented by a digital value of “0”, the data portion of the second sample of the conversion output is represented by a digital value of “2” or “3”, and the error portion of the first sample of the conversion output is at a logic value “1”.

15. The receiver as claimed in claim 11, wherein said processor adjusts the phase shifts of the interpolated clock signals to advance phases of the Interpolated clock signals when any one of the following conditions is met:

the data portion of the first sample of the conversion output is represented by a digital value of “3”, the data portion of the second sample of the conversion output is represented by a digital value of “0” or “1”, and the error portion of the first sample of the conversion output is at a logic value “1”;

the data portion of the first sample of the conversion output is represented by a digital value of “1” or “2”, the data portion of the second sample of the conversion output is represented by a digital value of “3”, and the error portion of the first sample of the conversion output is at a logic value “0”;

the data portion of the first sample of the conversion output is represented by a digital value of “1” or “2”, the data portion of the second sample of the conversion output is represented by a digital value of “0”, and the error portion of the first sample of the conversion output is at a logic value “1”; and the data portion of the first sample of the conversion output is represented by a digital value of “0”, the data portion of the second sample of the conversion output is represented by a digital value of “2” or “3”, and the error portion of the first sample of the conversion output is at a logic value “0”.

16. The receiver as claimed in claim 11, wherein said processor includes:

an equalizer connected to said decoder device to receive the decoded output, and converting the decoded output into the conversion output;

a 1:Q demultiplexer connected to said equalizer to receive the conversion output, and demultiplexing the conversion output into a demultiplexed output having a bit width that is Q times a bit width of the conversion output, where $Q \geq 2$; and an adaptive controller connected to said 1:Q demultiplexer to receive the demultiplexed output, further connected to said phase interpolator, and performing adaptive calibration on said phase interpolator to adjust the phase shifts of the interpolated clock signals with reference to the data portion and the error portion of the first sample of the conversion output and the data portion of the second sample of the conversion output.

17. The receiver as claimed in claim 16, wherein:

each of the decoded signals generated by said three-bit ADCs and said comparators of said decoder units of said decoders contains a plurality of samples;

the samples of the decoded signals are generated sequentially;

the samples of the conversion output respectively correspond to the samples of the decoded signals, and are generated sequentially; and each of the samples of the conversion output is generated based on the sample of the decoded signals that corresponds to the sample of the conversion output and on another sample of the conversion output that is generated immediately before the generation of the sample of the conversion output.

* * * * *